United States Patent
Miller et al.

(10) Patent No.: US 7,670,436 B2
(45) Date of Patent: Mar. 2, 2010

(54) SUPPORT RING ASSEMBLY

(75) Inventors: Keith A. Miller, Sunnyvale, CA (US);
Ilya Lavitsky, San Francisco, CA (US)

(73) Assignee: Applied Materials, Inc., Santa Clara, CA (US)

( * ) Notice: Subject to any disclaimer, the term of this patent is extended or adjusted under 35 U.S.C. 154(b) by 382 days.

(21) Appl. No.: 10/981,261

(22) Filed: Nov. 3, 2004

(65) Prior Publication Data
US 2006/0090706 A1    May 4, 2006

(51) Int. Cl.
*C23C 16/00*  (2006.01)
*C23F 1/00*   (2006.01)
*H01L 21/306* (2006.01)

(52) U.S. Cl. .............. 118/728; 118/729; 118/730; 156/345.51; 156/345.52; 156/345.53; 156/345.54; 156/915

(58) Field of Classification Search ............ 156/345.51, 156/915; 118/728; 204/192.12
See application file for complete search history.

(56) References Cited

U.S. PATENT DOCUMENTS

| | | |
|---|---|---|
| 3,482,082 A | 12/1969 | Isreeli |
| 3,679,460 A | 7/1972 | Reid |
| 4,384,918 A | 5/1983 | Abe |
| 4,412,133 A | 10/1983 | Eckes et al. |
| 4,419,201 A | 12/1983 | Levinstein et al. |
| 4,480,284 A | 10/1984 | Tojo et al. |
| 4,491,496 A | 1/1985 | Laporte et al. |
| 4,606,802 A | 8/1986 | Kobayashi et al. |
| 4,645,218 A | 2/1987 | Ooshio et al. |
| 4,665,463 A | 5/1987 | Ward et al. |
| 4,717,462 A | 1/1988 | Homma et al. |
| 4,832,781 A | 5/1989 | Mears |
| 4,872,250 A | 10/1989 | De Marco |
| 4,913,784 A | 4/1990 | Bogenschutz et al. |
| 4,995,958 A | 2/1991 | Anderson et al. |
| 5,055,964 A | 10/1991 | Logan et al. |
| 5,064,511 A | 11/1991 | Gobbetti et al. |
| 5,104,834 A | 4/1992 | Watanabe et al. |
| 5,117,121 A | 5/1992 | Watanabe et al. |
| 5,151,845 A | 9/1992 | Watanabe et al. |
| 5,166,856 A | 11/1992 | Liporace et al. |

(Continued)

FOREIGN PATENT DOCUMENTS

DE    19719133    11/1998

(Continued)

OTHER PUBLICATIONS

U.S. Patent Application entitled, "Chamber Component Having Knurled Surface"; filed Jun. 28, 2004; U.S. Appl. No. 10/880,235; Inventors: Tsai, et al.

(Continued)

*Primary Examiner*—Parviz Hassanzadeh
*Assistant Examiner*—Rakesh Dhingra
(74) *Attorney, Agent, or Firm*—Janah & Associates, P.C.

(57) ABSTRACT

A substrate ring assembly is provided for a substrate support having a peripheral edge. The assembly has an annular band having an inner perimeter that surrounds and at least partially covers the peripheral edge of the substrate support. The assembly also has a clamp to secure the annular band to the peripheral edge of the substrate support.

13 Claims, 6 Drawing Sheets

U.S. PATENT DOCUMENTS

| | | | |
|---|---|---|---|
| 5,191,506 A | 3/1993 | Logan et al. | |
| 5,215,639 A | 6/1993 | Boys | |
| 5,258,047 A | 11/1993 | Tokisue et al. | |
| 5,270,266 A | 12/1993 | Hirano et al. | |
| 5,275,683 A | 1/1994 | Arami et al. | |
| 5,280,156 A | 1/1994 | Niori et al. | |
| 5,314,597 A | 5/1994 | Harra | |
| 5,315,473 A | 5/1994 | Collins et al. | |
| 5,324,053 A | 6/1994 | Kubota et al. | |
| 5,325,261 A | 6/1994 | Horwitz | |
| 5,350,479 A | 9/1994 | Collins et al. | |
| 5,356,723 A | 10/1994 | Kimoto et al. | |
| 5,382,469 A | 1/1995 | Kubota et al. | |
| 5,391,275 A | 2/1995 | Mintz | |
| 5,401,319 A | 3/1995 | Banholzer et al. | |
| 5,407,551 A | 4/1995 | Sieck et al. | |
| 5,409,590 A | 4/1995 | Hurwitt et al. | |
| 5,429,711 A | 7/1995 | Watanabe et al. | |
| 5,433,835 A | 7/1995 | Demaray et al. | |
| 5,458,759 A | 10/1995 | Hosokawa et al. | |
| 5,460,694 A | 10/1995 | Schapira et al. | |
| 5,463,526 A | 10/1995 | Mundt | |
| 5,474,649 A | 12/1995 | Kava et al. | |
| 5,487,822 A | 1/1996 | Demaray et al. | |
| 5,490,913 A | 2/1996 | Schertler et al. | |
| 5,512,078 A | 4/1996 | Griffin | |
| 5,542,559 A | 8/1996 | Kawakami et al. | |
| 5,549,802 A | 8/1996 | Guo | |
| 5,587,039 A | 12/1996 | Salimian et al. | |
| 5,643,422 A | 7/1997 | Yamada | |
| 5,684,669 A | 11/1997 | Collins et al. | |
| 5,685,914 A * | 11/1997 | Hills et al. | 118/723 E |
| 5,685,959 A | 11/1997 | Bourez et al. | |
| 5,695,825 A | 12/1997 | Scruggs | |
| 5,700,179 A | 12/1997 | Hasegawa et al. | |
| 5,720,818 A | 2/1998 | Donde et al. | |
| 5,762,748 A | 6/1998 | Banholzer et al. | |
| 5,792,562 A | 8/1998 | Collins et al. | |
| 5,800,725 A | 9/1998 | Kato et al. | |
| 5,808,270 A | 9/1998 | Marantz et al. | |
| 5,812,362 A | 9/1998 | Ravi | |
| 5,821,166 A | 10/1998 | Hajime et al. | |
| 5,824,197 A | 10/1998 | Tanaka | |
| 5,830,327 A | 11/1998 | Kolnekow | |
| 5,858,100 A | 1/1999 | Maeda et al. | |
| 5,876,573 A | 3/1999 | Moslehi et al. | |
| 5,879,523 A | 3/1999 | Wang et al. | |
| 5,879,524 A | 3/1999 | Hurwitt et al. | |
| 5,886,863 A | 3/1999 | Nagasaki et al. | |
| 5,903,428 A | 5/1999 | Grimard et al. | |
| 5,910,338 A | 6/1999 | Donde et al. | |
| 5,916,378 A | 6/1999 | Bailey et al. | |
| 5,916,454 A | 6/1999 | Richardson et al. | |
| 5,920,764 A | 7/1999 | Hanson | |
| 5,942,041 A | 8/1999 | Lo et al. | |
| 5,942,445 A | 8/1999 | Kato et al. | |
| 5,948,288 A | 9/1999 | Treves et al. | |
| 5,951,374 A | 9/1999 | Kato et al. | |
| 5,953,827 A | 9/1999 | Or et al. | |
| 5,963,778 A | 10/1999 | Stellrecht | |
| 5,976,327 A | 11/1999 | Tanaka | |
| 6,010,583 A | 1/2000 | Annavarapu et al. | |
| 6,015,465 A | 1/2000 | Kholodenko et al. | |
| 6,026,666 A | 2/2000 | Zimmermann et al. | |
| 6,051,114 A | 4/2000 | Yao et al. | |
| 6,059,945 A | 5/2000 | Fu et al. | |
| 6,071,389 A | 6/2000 | Zhang | |
| 6,073,830 A | 6/2000 | Hunt et al. | |
| 6,086,735 A | 7/2000 | Gilman et al. | |
| 6,108,189 A | 8/2000 | Weldon et al. | |
| 6,120,640 A | 9/2000 | Shih et al. | |
| 6,143,432 A | 11/2000 | de Rochemont et al. | |
| 6,146,509 A | 11/2000 | Aragon | |
| 6,150,762 A | 11/2000 | Kim et al. | |
| 6,152,071 A | 11/2000 | Akiyama et al. | |
| 6,159,299 A * | 12/2000 | Koai et al. | 118/715 |
| 6,162,297 A | 12/2000 | Mintz et al. | |
| 6,170,429 B1 | 1/2001 | Schoepp et al. | |
| 6,183,614 B1 | 2/2001 | Fu | |
| 6,183,686 B1 | 2/2001 | Bardus et al. | |
| 6,190,516 B1 | 2/2001 | Xiong et al. | |
| 6,198,067 B1 | 3/2001 | Ikeda et al. | |
| 6,199,259 B1 | 3/2001 | Demaray et al. | |
| 6,221,217 B1 | 4/2001 | Moslehi et al. | |
| 6,227,435 B1 | 5/2001 | Lazarz et al. | |
| 6,238,528 B1 | 5/2001 | Xu et al. | |
| 6,248,667 B1 | 6/2001 | Kim et al. | |
| 6,250,251 B1 | 6/2001 | Akiyama et al. | |
| 6,269,670 B2 | 8/2001 | Koestermeier | |
| 6,274,008 B1 | 8/2001 | Gopalraja et al. | |
| 6,276,997 B1 | 8/2001 | Li | |
| 6,284,093 B1 * | 9/2001 | Ke et al. | 156/345.51 |
| 6,284,628 B1 | 9/2001 | Kuwahara et al. | |
| 6,287,437 B1 | 9/2001 | Pandhumsoporn et al. | |
| 6,299,740 B1 | 10/2001 | Hieronymi et al. | |
| 6,306,226 B1 | 10/2001 | Lino et al. | |
| 6,306,498 B1 | 10/2001 | Yuuki et al. | |
| 6,338,781 B1 | 1/2002 | Sichmann et al. | |
| 6,338,906 B1 | 1/2002 | Ritland et al. | |
| 6,340,415 B1 | 1/2002 | Raaijmakers et al. | |
| 6,344,114 B1 | 2/2002 | Sichmann et al. | |
| 6,365,010 B1 | 4/2002 | Hollars | |
| 6,372,609 B1 | 4/2002 | Aga | |
| 6,387,809 B2 | 5/2002 | Toyama | |
| 6,416,634 B1 | 7/2002 | Mostovoy et al. | |
| 6,423,175 B1 | 7/2002 | Huang et al. | |
| 6,440,221 B2 | 8/2002 | Shamouilian et al. | |
| 6,464,794 B1 * | 10/2002 | Park et al. | 118/728 |
| 6,475,336 B1 * | 11/2002 | Hubacek | 156/345.51 |
| 6,500,321 B1 | 12/2002 | Ashtiani et al. | |
| 6,506,312 B1 | 1/2003 | Bottomfield | |
| 6,555,471 B2 | 4/2003 | Sandhu et al. | |
| 6,558,505 B2 | 5/2003 | Suzuki et al. | |
| 6,576,909 B2 | 6/2003 | Donaldson et al. | |
| 6,579,431 B1 | 6/2003 | Bolcavage et al. | |
| 6,599,405 B2 | 7/2003 | Hunt et al. | |
| 6,619,537 B1 | 9/2003 | Zhang et al. | |
| 6,620,736 B2 * | 9/2003 | Drewery | 438/710 |
| 6,623,597 B1 * | 9/2003 | Han et al. | 156/345.51 |
| 6,623,610 B1 | 9/2003 | Onishi | |
| 6,627,050 B2 | 9/2003 | Miller et al. | |
| 6,652,668 B1 | 11/2003 | Perry et al. | |
| 6,660,135 B2 | 12/2003 | Yu et al. | |
| 6,708,870 B2 | 3/2004 | Koenigsmann et al. | |
| 6,743,340 B2 * | 6/2004 | Fu | 204/192.12 |
| 6,749,103 B1 | 6/2004 | Ivanov et al. | |
| 6,776,879 B2 | 8/2004 | Yamamoto et al. | |
| 6,777,045 B2 | 8/2004 | Lin et al. | |
| 6,797,362 B2 | 9/2004 | Parfeniuk et al. | |
| 6,824,652 B2 | 11/2004 | Park | |
| 6,840,427 B2 | 1/2005 | Ivanov | |
| 6,858,116 B2 | 2/2005 | Okabe et al. | |
| 6,872,284 B2 | 3/2005 | Ivanov et al. | |
| 6,916,407 B2 | 7/2005 | Vosser et al. | |
| 6,933,025 B2 | 8/2005 | Lin et al. | |
| 6,955,852 B2 | 10/2005 | Ivanov | |
| 6,992,261 B2 | 1/2006 | Kachalov et al. | |
| 7,026,009 B2 | 4/2006 | Lin et al. | |
| 7,063,773 B2 | 6/2006 | Ivanov et al. | |
| 7,131,883 B2 | 11/2006 | Park et al. | |
| 7,146,703 B2 | 12/2006 | Ivanov | |
| 2001/0001367 A1 | 5/2001 | Koestermeier | |
| 2001/0033706 A1 | 10/2001 | Shimomura et al. | |
| 2001/0045353 A1 | 11/2001 | Hieronymi et al. | |

| | | | |
|---|---|---|---|
| 2002/0029745 A1* | 3/2002 | Nagaiwa et al. ............ | 118/723 E |
| 2002/0033330 A1 | 3/2002 | Demaray et al. | |
| 2002/0076490 A1* | 6/2002 | Chiang et al. ............ | 427/248.1 |
| 2002/0086118 A1 | 7/2002 | Chang et al. | |
| 2002/0090464 A1 | 7/2002 | Jiang et al. | |
| 2002/0100680 A1 | 8/2002 | Yamamoto et al. | |
| 2003/0026917 A1 | 2/2003 | Lin et al. | |
| 2003/0047464 A1 | 3/2003 | Sun et al. | |
| 2003/0116276 A1 | 6/2003 | Weldon et al. | |
| 2003/0118731 A1 | 6/2003 | He et al. | |
| 2003/0127319 A1 | 7/2003 | Demaray et al. | |
| 2003/0168168 A1 | 9/2003 | Liu et al. | |
| 2003/0173526 A1 | 9/2003 | Popiolkowski et al. | |
| 2003/0185965 A1 | 10/2003 | Lin et al. | |
| 2003/0218054 A1 | 11/2003 | Koenigsmann et al. | |
| 2004/0056070 A1 | 3/2004 | Ivanov | |
| 2004/0056211 A1 | 3/2004 | Popiolkowski et al. | |
| 2004/0079634 A1 | 4/2004 | Wickersham et al. | |
| 2004/0099285 A1 | 5/2004 | Wang et al. | |
| 2004/0113364 A1 | 6/2004 | Ivanov | |
| 2004/0256226 A1 | 12/2004 | Wickersham | |
| 2004/0261946 A1* | 12/2004 | Endoh et al. ............ | 156/345.15 |
| 2005/0011749 A1 | 1/2005 | Kachalov et al. | |
| 2005/0061857 A1 | 3/2005 | Hunt et al. | |
| 2005/0067469 A1 | 3/2005 | Facey et al. | |
| 2005/0092604 A1 | 5/2005 | Ivanov | |
| 2005/0147150 A1 | 7/2005 | Wickersham et al. | |
| 2005/0161322 A1 | 7/2005 | Smathers | |
| 2005/0178653 A1 | 8/2005 | Fisher | |
| 2005/0211548 A1 | 9/2005 | Gung et al. | |
| 2005/0282358 A1 | 12/2005 | Di Cioccio et al. | |
| 2006/0005767 A1 | 1/2006 | Tsai et al. | |
| 2006/0070876 A1 | 4/2006 | Wu et al. | |
| 2006/0108217 A1 | 5/2006 | Krempel-Hesse et al. | |
| 2006/0188742 A1 | 8/2006 | West et al. | |
| 2006/0283703 A1 | 12/2006 | Lee et al. | |
| 2007/0102286 A1 | 5/2007 | Schieble et al. | |
| 2007/0125646 A1 | 6/2007 | Young et al. | |
| 2007/0170052 A1 | 7/2007 | Ritchie et al. | |
| 2007/0173059 A1 | 7/2007 | Young et al. | |
| 2007/0215463 A1 | 9/2007 | Parkhe et al. | |
| 2008/0178801 A1 | 7/2008 | Pavloff et al. | |
| 2008/0257263 A1 | 10/2008 | Pavloff et al. | |

FOREIGN PATENT DOCUMENTS

| | | |
|---|---|---|
| EP | 0239349 | 9/1987 |
| EP | 0439000 | 7/1991 |
| EP | 0601788 | 6/1994 |
| EP | 0635869 | 1/1995 |
| EP | 0791956 | 8/1997 |
| EP | 0818803 A | 1/1998 |
| EP | 0838838 | 4/1998 |
| EP | 1094496 A | 4/2001 |
| JP | 54-162969 | 12/1979 |
| JP | 02-027748 | 1/1990 |
| JP | 04-367247 | 12/1992 |
| JP | 06-232243 | 8/1994 |
| JP | 07-197272 | 8/1995 |
| JP | 09-017850 | 1/1997 |
| JP | 11-137440 | 5/1999 |
| JP | 2002-69695 | 3/2002 |
| JP | 2002-69696 | 3/2002 |
| WO | WO 99/17336 A1 | 4/1999 |
| WO | WO 02/093624 | 11/2002 |
| WO | WO 2004/010494 A2 | 1/2004 |
| WO | WO 2005/071137 | 8/2005 |
| WO | WO 2008/079722 | 7/2008 |

OTHER PUBLICATIONS

Daviet, et al., "Electrostatic Clamping Applied to Semiconductor Plasma Processing-I. Theoretical Modeling," J. Electrochem. Soc., 140(11):3245-3255 (Nov. 1993).

Daviet, et al., "Electrostatic Clamping Applied to Semiconductor Plasma Processing-II. Experimental Results," J. Electrochem. Soc., 140(11):3256-3261 (Nov. 1993).

Nakasuji, et al., "Low Voltage and High Speed Operating Electrostatic Wafer Chuck," J. Vac. Sci. Technol. A, 10(6):3573-3578 (Nov./Dec. 1992).

Rosenberg, RW, "Increasing PVD Tool Uptime and Particle Control with Twin-Wire-Arc Spray Coatings", Mar. 2001, p. 103-105,108, 11, vol. 19, No. 3, Cannon Comm., Santa Monica, CA.

Tucker, Jr., Robert C., "Plasma and Detonation Gun Deposition Techniques and Coating Properties," Union Carbide Corp., Coatings Service Dept., Indianapolis, IN, pp. 454-489.

Watanabe, et al., "Effect of Additives on the Electrostatic Force of Alumina Electrostatic Chucks," J. of the Ceramic Soc. of Jpn., 100(1):1-6 (1992).

Watanabe, et al., "Electrostatic Force and Absorption Current of Alumina Electrostatic Chucks," Jpn. J. Appl. Phy., 31(pt1, No. 7):2145-2150 (1992).

Watanabe, et al., "Relationship Between Electrical Resistivity and Electrostatic Force of Alumina Electrostatic Chuck," Jpn. J. Appl. Phy., 32(Pt1, No. 2):864-871 (1993).

Watanabe, et al., "Resistivity and Microstructure of Alumina Ceramics Added with TiO2 Fired in Reducing Atmosphere," J. of the Ceramic Doc. of Jpn. Int. Ed., 101-1076-1083.

Wright, et al., "Low Temperature Etch Chuck: Modeling and Experimental Results of Heat Transfer and Wafer Temperature," J. Vac. Sci. Technol. A, 10(4):1065-1070(Jul./Aug. 1992.).

U.S. Appl. No. 60/739,658 to Young et al., filed Nov. 25, 2005.

U.S. Appl. No. 60/788,378 to Ritchie et al., filed Mar. 30, 2006.

* cited by examiner

SUPPORT RING ASSEMBLY

BACKGROUND

Embodiments of the present invention relate to a support ring assembly to support a substrate in a process chamber.

In the processing of substrates, such as semiconductor wafers and displays, a substrate is placed in a process chamber and exposed to an energized gas to deposit or etch material on the substrate. A typical process chamber comprises process components that include an enclosure wall that encloses a process zone, a gas supply to provide a gas in the chamber, a gas energizer to energize the process gas to process the substrate, a substrate support, and a gas exhaust. The process chamber components can also comprise a process kit, which typically includes one or more parts that can assist in securing and protecting the substrate during processing, such as for example, substrate rings which are rings that are located about the periphery of the substrate, such as deposition rings, cover rings and shadow rings.

In physical vapor deposition (PVD) processes, a substrate ring comprising a deposition ring is provided about the periphery of the substrate. The deposition ring typically surrounds the substrate and has a lip or ledge that rests on the substrate support. The ring shields the sidewall surfaces and peripheral edge of the substrate support that would otherwise be exposed to the energized gas in the chamber, from deposition of process residues. Thus, the deposition ring reduces the accumulation of process residues on the support, which would eventually flake off and contaminate the substrate. The deposition ring can also reduce erosion of the support structure by the energized gas. Providing a deposition ring also lowers the frequency with which the support assembly requires cleaning, because deposition ring itself can be periodically removed from the chamber and cleaned, for example, with HF and $HNO_3$, to remove process residues that accumulate on the ring during substrate process cycles.

However, certain processes, such as for example, tantalum PVD processes with their exposure to the energized gas in the chamber during processing, heats up the deposition ring. Typically, the deposition rings, such as for example aluminum oxide deposition rings do not exchange a sufficient amount of heat with their surroundings in the vacuum environment to lower the temperature of the rings to acceptable levels. Excessive heating of the deposition ring is detrimental, because thermal stresses between the deposition ring and process residues accumulated on the ring, result in the peeling or spalling of the process residues from the deposition ring, and resultant contamination of the substrate. Also, the hot deposition ring can create temperature gradients emanating from the periphery of the substrate, which change the temperature of the substrate or energized gas during processing. Yet another problem with conventional rings, such as aluminum oxide deposition rings, is that they erode during cleaning and refurbishment processes, reducing their lifetime. This is especially true when cleaning process residues that are chemically difficult to remove, such as for example, tantalum deposits formed on aluminum oxide rings.

Accordingly, it is desirable to have a substrate ring, such as a deposition ring, that does not excessively increase in temperature during the processing of substrates. It is furthermore desirable to have a substrate ring that is not excessively eroded during cleaning of the ring. It is furthermore desirable to have a substrate ring that can reduce the formation of excessively high temperature gradients during substrate processing.

SUMMARY

In one version, a substrate ring assembly is provided for a substrate support having a peripheral edge. The assembly has an annular band having an inner perimeter that surrounds and at least partially covers the peripheral edge of the substrate support. The assembly also has a clamp to secure the annular band to the peripheral edge of the substrate support.

In another version, the substrate ring assembly has an annular band having an inner perimeter that at least partially surrounds and at least partially covers the peripheral edge of the substrate support. The annular band has at least one protrusion on a top surface of the annular band that is adapted to inhibit a flow of process gas over the top surface. A foot extends downwardly from the annular band, and is adapted to press against a surface of the substrate support.

In another version, the substrate ring assembly has an annular band having an inner perimeter that surrounds and at least partially covers a peripheral edge of the substrate support, and a foot extending downwardly from the annular band. The foot is shaped, sized and positioned to allow the band, when the band is held against the substrate support, to exert substantially a compressive stress on the substrate support.

DRAWINGS

These features, aspects and advantages of the present invention will become better understood with regard to the following description, appended claims, and accompanying drawings, which illustrate examples of the invention. However, it is to be understood that each of the features can be used in the invention in general, not merely in the context of the particular drawings, and the invention includes any combination of these features, where:

FIG. 1b is a partial top view of an embodiment of a substrate support having the substrate ring assembly of FIG. 1a;

DESCRIPTION

Figure 1A:
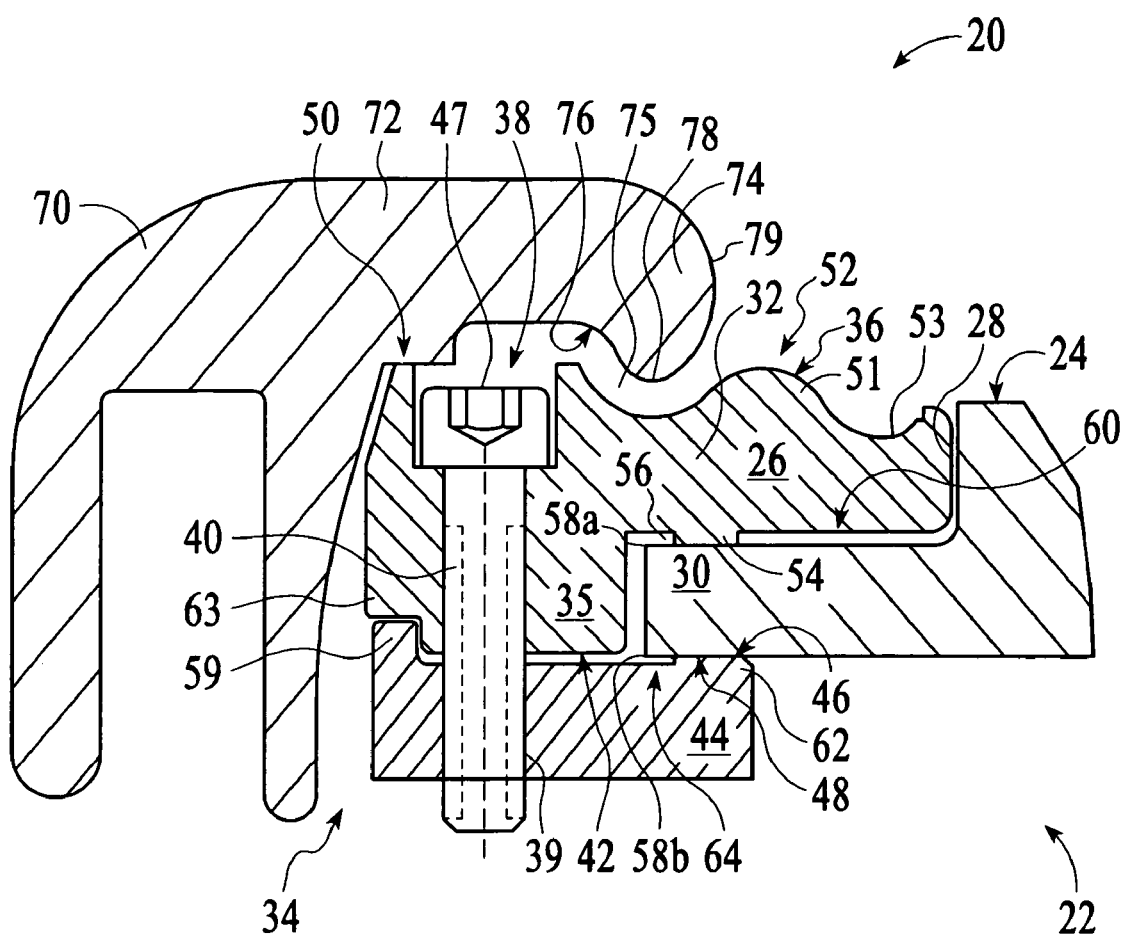
FIG. 1a is a partial sectional side view of an embodiment of a substrate ring assembly having a clamped annular band.
Figure 1B:
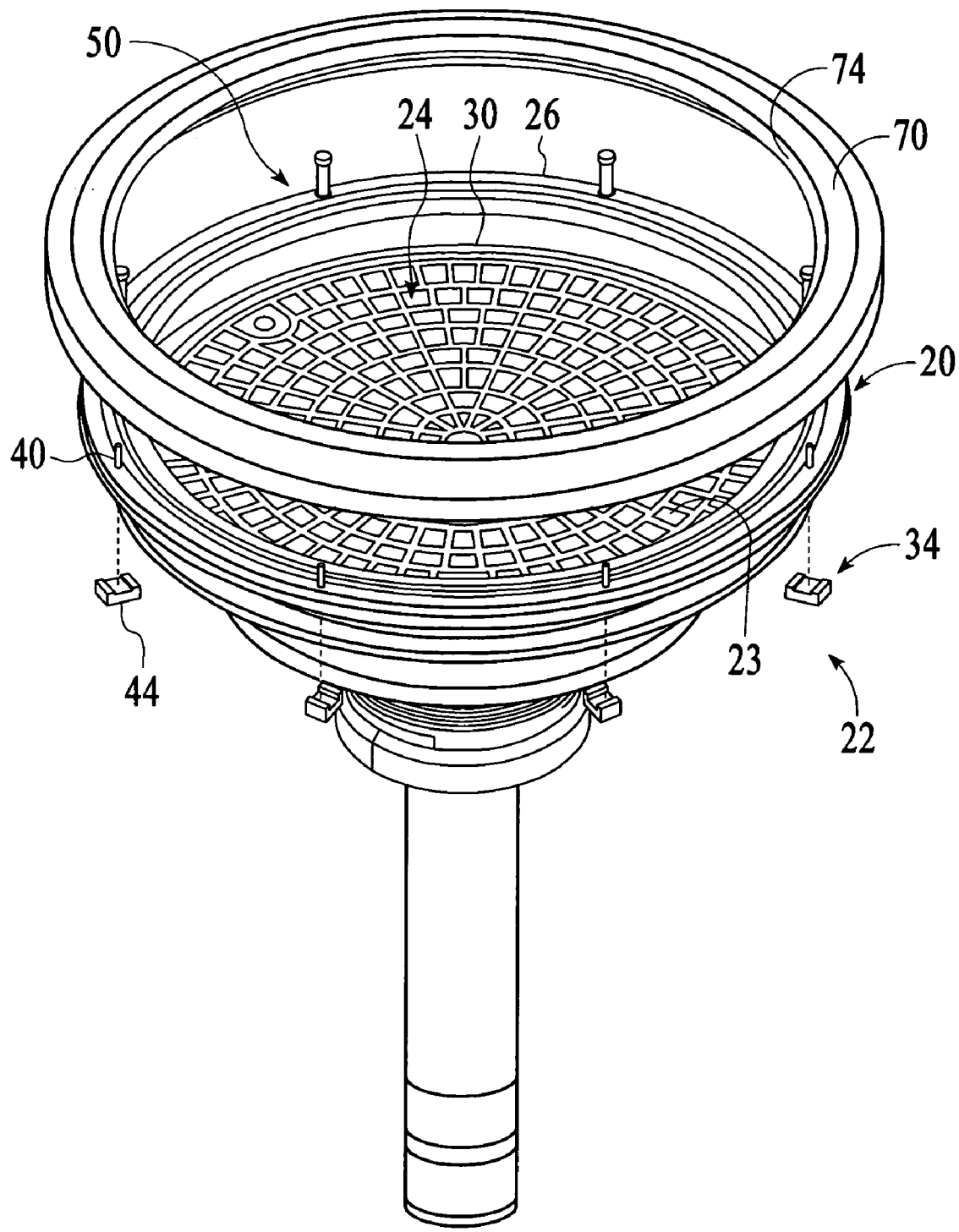
Figure 3:
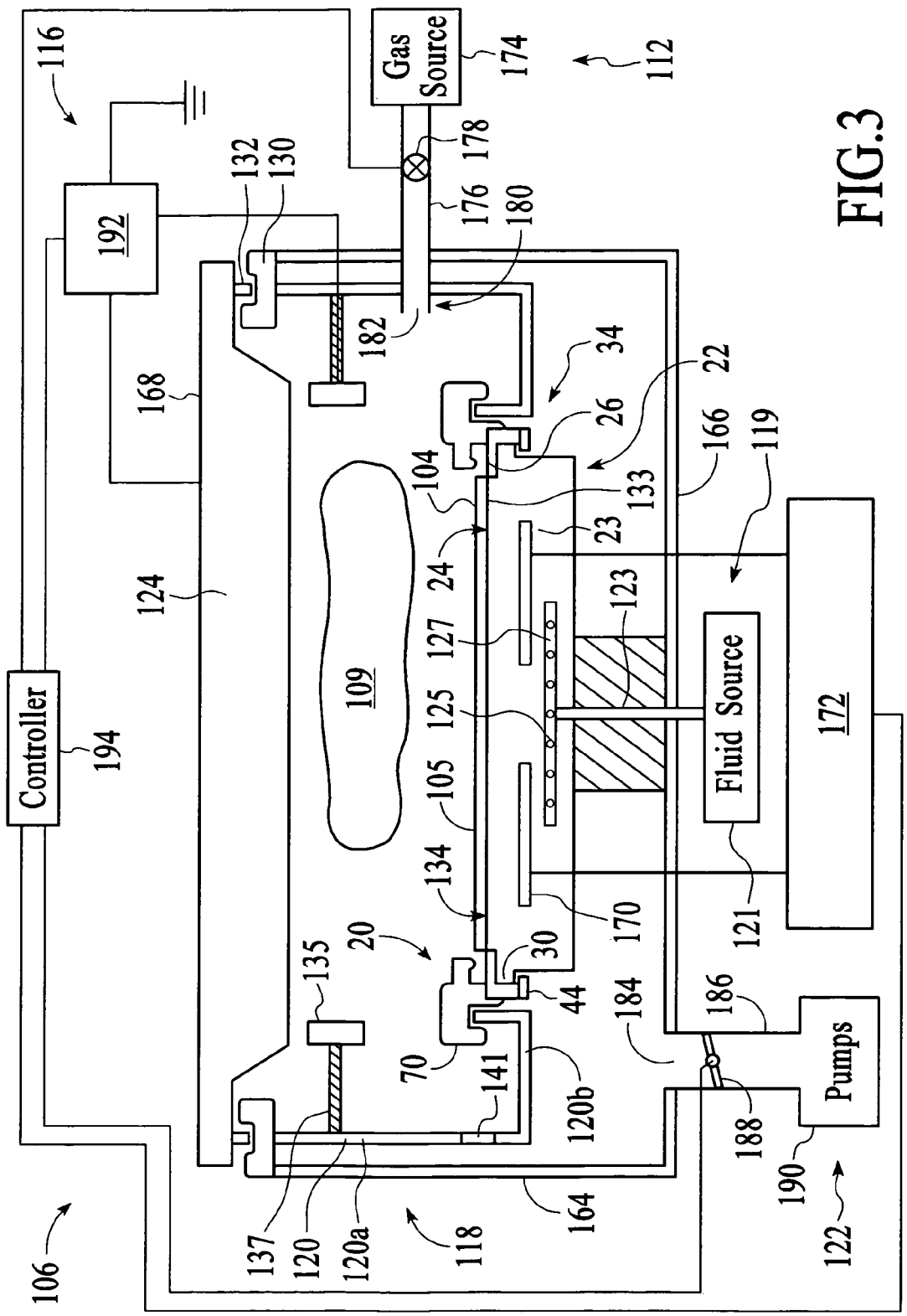
FIG. 3 is a partial sectional side view of an embodiment of process chamber having a substrate ring assembly.

An exemplary version of a substrate ring assembly 20 that can be used to cover or protect at least a portion of a substrate support 22 in a substrate processing environment, is shown in FIGS. 1a and 1b. The substrate support 22, which may comprise for example an electrostatic chuck 23, has a substrate receiving surface 24 that receives and supports a substrate 104 during processing, as shown in FIG. 3. The substrate ring assembly 20 is provided to protect at least a portion of the support 22 by covering at least a portion of the support 22. The substrate ring assembly 20 comprises an annular band 26 having an inner perimeter 28 that is adapted to surround a periphery of the substrate 104 and the substrate receiving surface 24. The inner perimeter 28 also surrounds the substrate receiving surface 24 of the support 22, and the annular band 26 protects regions of the support 22 that are not covered by the substrate 104 during processing. For example, the annular band 26 may surround and at least partially cover a peripheral edge 30 of the support 22 that would otherwise be exposed to the processing environment. In the version shown in FIG. 1a, the substrate ring assembly 20 comprises an annular band 26 having a top portion 32 that extends over the peripheral edge 30 of the support 22 to protect the peripheral edge 30, and a bottom portion 35 that extends downwardly and adjacent to the side of the peripheral edge 30. The annular band 26 can protect the covered surfaces of the support from, for example, erosion by energized process gases or the excessive deposition of process residues on these surfaces.

In one version, the substrate ring assembly 20 comprises a clamp 34 that clamps a portion of the annular band 26 to the substrate support 22. Clamping of the annular band 26 to the support 22 provides improved processing results at least in part because better heat exchange can occur between the clamped band 26 and the support 22. Portions of the annular band 26 can become excessively heated during substrate processing, such as for example the top surface 36 of the annular band 26 that is exposed to energized plasma of process gas. Excessive heating of the top surface 36 can lead to a thermal expansion mismatch between the annular band 26 and any process residues deposited on the top surface 36 of the band 26, which can cause the process residues to flake away from the top surface 36 and potentially contaminate the substrate 104. Clamping of the annular band 26 to the support 22 also allows better heat exchange between the band 26 and the support 22, to improve the temperature control of the annular band 26. For example, the support 22 may be temperature controlled, for example, by providing a temperature controlled cooling plate 127 comprising cooling conduits 123 in the support 22, as shown for example in FIG. 3, allowing for good cooling of the clamped annular band 26. Clamping of the annular band 26 against the support 22 can also provide more secure coverage and protection of the support 22. The improved temperature control of the band 26 also allows for fabrication of the band out of more erosion resistant metal materials, such as for example, stainless steel, titanium or aluminum.

One embodiment of a substrate ring assembly 20 comprising a clamp 34 is shown in FIGS. 1a and 1b. In this version, the annular band 26 comprises at least one opening 38 that extends therethrough, such as for example a substantially vertical opening extending from the top surface 36 of the annular band 26 to a bottom surface 42 of the band. The clamp 34 comprises a fastener 40 that is shaped and sized to pass through the opening 38 to fasten the annular band to the support 22. In the version shown in FIG. 1a, the clamp 34 further comprises a bracket 44 that is adapted to receive the fastener 40 and secure the annular band 26 to the support 22. The bracket 44 can be braced against or otherwise connected to the substrate support 22 to clamp the annular band 26 against the support 22. For example, the bracket 44 may comprise a clamping surface 46 that is pressed against a surface of the support 22, such as the bottom surface 48 of the peripheral edge 30, to clamp the annular band 26 against the support 22, as shown for example in FIGS. 1a and 1b. The clamping surface 46 may also press against the bottom surface 42 of the annular band 26.

The fastener 40 comprises a structure suitable for passing through the opening 38 in the annular band 26 and connecting to the bracket 44, such as for example at least one of a screw, clip, spring or other connector structure. For example, in one version, the fastener 40 can comprise a threaded screw that fits through the opening 38 in the annular band 26 and at least partially through an opening 39 in the bracket 44, and where the opening 39 of the bracket 44 comprises complimentary threading that allows the bracket 44 to be tightened against the support 22 upon turning the screw. Also, a desired number of openings 38 and fasteners 40 can be provided to secure the annular band 26 to the support 22. For example, the support ring assembly 20 can comprise from about 3 to about 24 openings 38, such as about 8 openings 38, that are placed in a desired configuration about the annular band 26. In the version shown in FIGS. 1a and 1b, the openings 38 are positioned towards a periphery 50 of the annular band 26. The openings 38 extend through the top and bottom portions 32,42 of the annular band 26 to clamp the band 26 to the substrate support 22. Also, the bracket 44 may comprise features that enable the bracket to "lock" on to the annular band 26 to better secure the band 26. For example, the bracket 44 can comprise a raised wall 59 that is adapted to press against a peripheral sidewall 63 of the annular band, to lock the annular band into a desired clamped position.

Figure 1C:
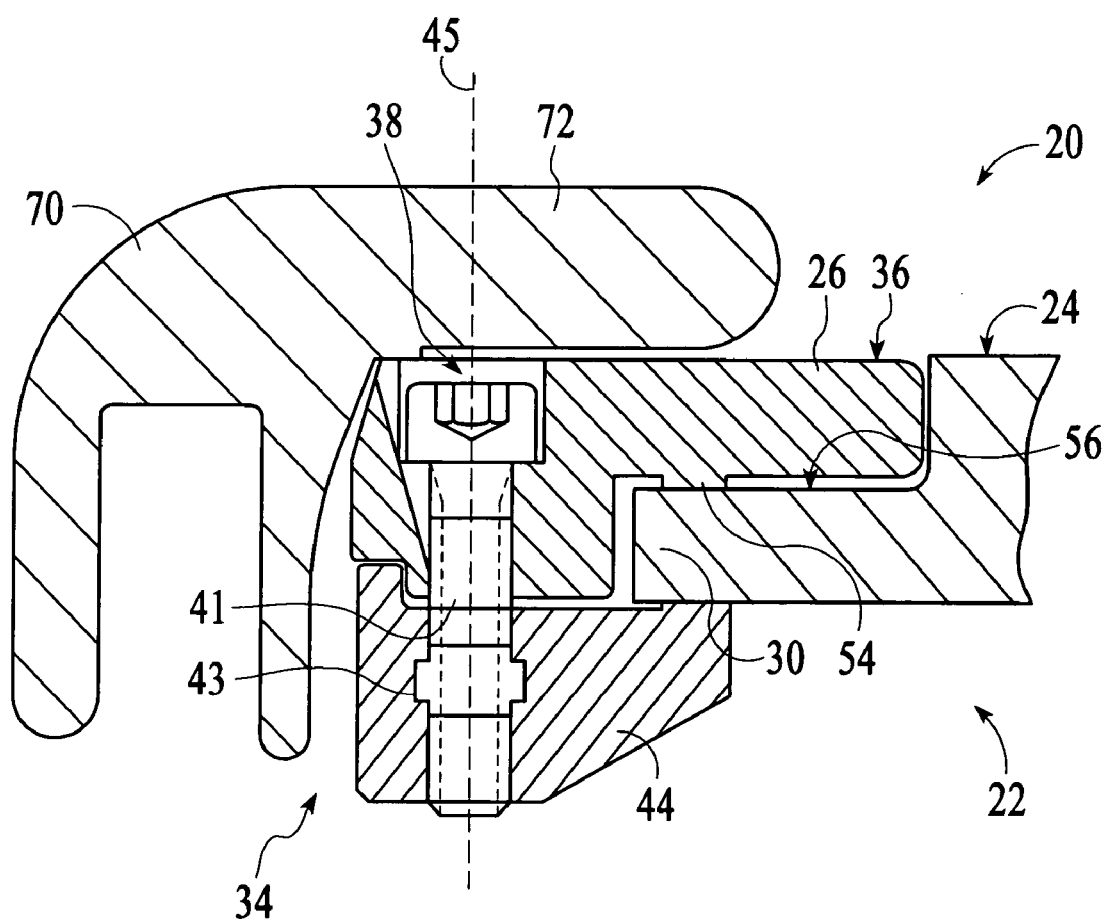
FIG. 1c is a partial sectional side view of an embodiment of the substrate ring assembly of FIG. 1a having a swiveling fastener.

In yet another embodiment, the clamp 34 comprises a swiveling fastener 41 that is adapted to rotate the bracket 44 into a desired position to clamp the annular band 26 against the support 22, as shown for example in FIG. 1c. For example, the swiveling fastener 41 can comprise a swivel nut 43 that allows the bracket 44 to be rotated into place against the support 22. The swiveling fastener 41 may allow the bracket 44 to rotate about the axis 45 of the fastener 41 by turning the swiveling fastener 41, such that for example the bracket can be rotated into or away from the clamping position by simply rotating the fastener 41, for example by turning the top 47 of the fastener 41 as shown in FIG. 1a. Thus, the swiveling fastener 41 allows ready removal of the substrate ring assembly 20, for example for cleaning of the assembly, substantially without requiring removal of the fastener 41 from the bracket 44, and even substantially without requiring access to a portion of the ring assembly 20 or other element below the peripheral edge 30 of the support 22.

In one version, the top surface 36 of the annular band comprises a textured surface that is adapted to reduce the deposition of process deposits on undesired areas of the support 22 and support assembly 20. The top surface 36 desirably comprises features 52 that are shaped, sized and positioned to reduce the deposition of process residues on at least a portion of the surface 36. For example, the top surface 36 may inhibit a flow or migration of process residues towards one or more openings 38 in the annular band at a periphery 50 of the annular band. The top surface 36 may collect process residues in depressions in the surface 36 and inhibit the migration of these residues towards the substrate 104 to reduce contamination of the substrate 104. In one version, the top surface 36 comprises at least one feature 52 comprising a protrusion 51 that is sized and shaped—as well as positioned on the top surface 36—to reduce the flow or migration of process residues towards the substrate. The protrusion 51 may comprise, for example, a raised ring or other feature 52 that may be formed on the surface 36. Textured features 52 on the surface 36 can also comprise, for example, one or more grooves 53 or other depressions in the surface 36. The grooves 53 extend below the top surface 36 and each comprise a rounded bottom apex, and the protrusion 51 and grooves 53 are concentric to the circumference of the annular band, as shown for example, in FIGS. 1A and 1B. The textured features 52 can be formed by methods known to those of ordinary skill in the art, such as for example by at least one of machining, knurling, or etching the features 52 into the top surface 36. Embodiments of surfaces having textured features are described in, for example, U.S. patent application Ser. No. 10/880,235 to Tsai et al, assigned to Applied Materials, Inc, and filed on Jun. 28, 2004, which is herein incorporated by reference in its entirety.

In one embodiment, the ring assembly 20 comprises a foot 54 that extends downwardly from the annular band 26 to press against the substrate support 22. The foot 54 is desirably shaped and sized to press against the substrate support 20 substantially without inducing cracks or fractures in the support 20, and thus provides an improved structure for bracing the band 26 against the support. For example, as shown in FIG. 1a, the foot 54 may comprise a substantially vertical post that extend downwardly from the top portion 32 of the annular band 26 to press against a top surface 56 of the peripheral edge 30. The foot 54 desirably exerts substantially only a compressive stress on the peripheral edge 30 of the support 20, and substantially no shearing or other horizontally directed stress that could induce cracking or fracturing of the peripheral ledge. The foot 54 is also desirably positioned such that it substantially does not press against a top corner 58a on the peripheral edge 30 or other part of the edge 30 that may be susceptible to cracking or chipping. In one version, the foot 54 contacts substantially only the top surface 56 of the peripheral edge 30, and does not cover more than about 70% of this peripheral edge surface 56.

The annular band 26 desirably also comprises recessed surface regions 60 about the downwardly extending foot 54 that substantially do not contact the peripheral edge 30 of the support 22, to reduce the stress of the band 26 on the peripheral edge 30 of the support 22. For example, one or more of the recessed regions 60 may be about a top corner 58a of the peripheral edge 30, to reduce the amount of stress exerted on the top corner 58a. Other parts of the substrate ring assembly 20 may also be adapted to reduce the amount of pressure and/or stress exerted on the peripheral edge 30 of the support 22. For example, the bracket 44 may comprise a raised lip 62 that presses against the peripheral edge 30 with substantially only a compressive force, and an adjacent recess 64 about a bottom corner 58b of the peripheral edge to reduce pressure on the bottom corner 58b. The bracket 44 and annular band foot 54 may also be complementarily positioned such that the clamping force of one against the peripheral edge 30 is at least partially counteracted by the other. For example, the bracket 44 may press against the peripheral edge 30 substantially directly below where the foot 54 presses, so the force on the peripheral edge 30 is substantially equal above and below the peripheral edge 30. Thus, the substrate ring assembly 20 is adapted to reduce cracking or fracturing of the substrate support 22 by exerting substantially only a vertical, compressive stress on the peripheral edge 30 of the support, and substantially without pressing against portions of the support 22 that are readily cracked or chipped, such as corners 58a,b of the peripheral edge 30.

In one version, the substrate ring assembly 20 comprises a cover ring 70 that at least partially surrounds and at least partially covers a periphery 50 of the annular band 26, as shown for example in FIGS. 1a,b and c. The cover ring 70 comprises a radially inwardly extending ledge 72 that extends across at least a portion of the annular band 26 to cover and protect portions of the band 26. In one version, the cover ring 70 comprises a downwardly extending protrusion 74 that is sized and shaped to inhibit the deposition of process deposits on at least a portion of the top surface 36 of the annular band 26, for example to inhibit the flow of at least one of process gas and process deposits over the surface 36. The protrusion 74 may comprise, for example, an annular lip 78 at the inner diameter 79 of the inwardly extending ledge 72, that extends downwards about 2 mm to about 5 mm from a bottom surface 76 of the cover ring 70. In one version, the protrusion 74 is sized, shaped, and positioned such that the protrusion 74 complements a textured top surface 36 of the annular band 26. For example, the protrusion 74 may extend downwardly and adjacent to a raised protrusion 51 arising from the top surface 36 of the annular band 26, to form a convoluted and constricted flow path 75 between the cover ring 70 and annular band 26 that inhibits the flow of process deposits past the protrusion 74. The protrusion 74 may even extend into a depressed feature such as a groove 53 in the top surface 36 of the band 26, to further block a flow or migration of process deposits across the surface 26. The cover ring 70 is preferably fabricated of an erosion resistant material, which may be a metallic material such as for example at least one of stainless steel and titanium. The cover ring 70 may also be fabricated of a ceramic material, such as for example aluminum oxide. The cover ring 70 may also comprise a textured top surface to which process residues may adhere.

Figure 2A:
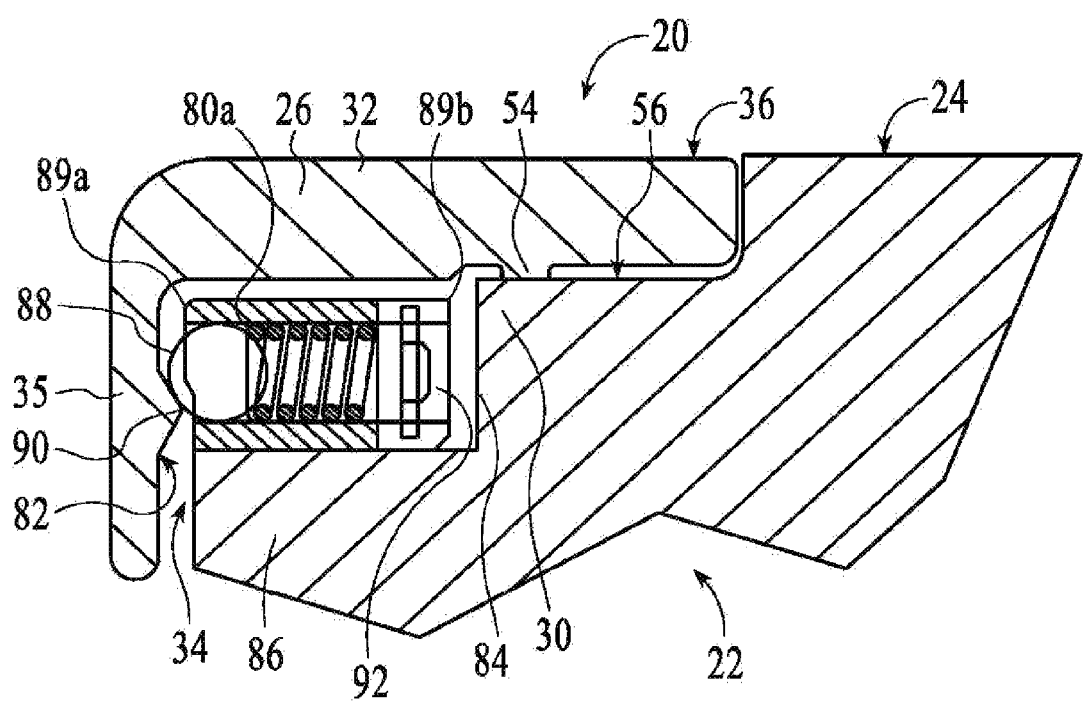
FIG. 2a is a partial sectional side view of an embodiment of a substrate ring assembly having a clamp comprising a radial spring.
Figure 2B:
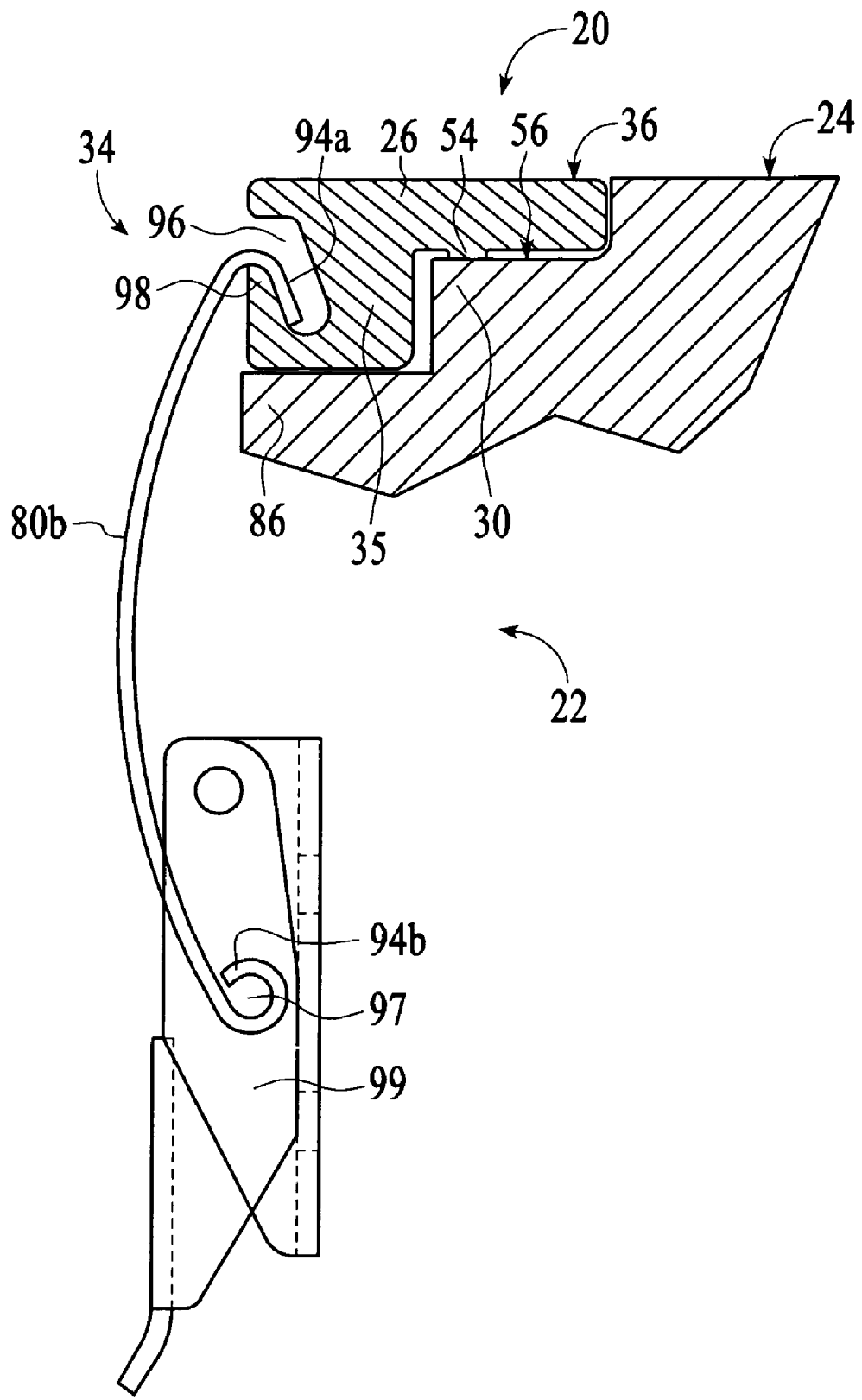
FIG. 2b is a partial sectional side view of an embodiment of a substrate ring assembly having a clamp comprising an extended spring.

In yet another version, the substrate ring assembly 20 comprises a clamp 34 having a spring 80a,b to hold the annular band 26 against the substrate support 22, as shown for example in FIGS. 2a and 2b. In the version shown in FIG. 2a, the clamp 34 comprises a radial spring 80a that is adapted to be compressed between the annular band 26 and the support 22, such as for example a coil spring. For example, the radial spring 80a can be compressed between an interior surface 82 of the bottom portion 35 of the annular band 26, and a sidewall 84 of the peripheral edge 30 of the support 22. In the version shown in FIG. 2a, the radial spring 80a is also supported underneath by a support ledge 86 that extends past the peripheral edge 30. The compressed radial spring 80a exerts a force on the annular band 26 and support 22 that resists slipping and other movements of the annular band 26 to secure the band 26 in place.

The clamp 34 can also comprise a ball bearing 88 at one or more ends 89a,b of the radial spring 80a,b to exert a compressional force to secure the annular band 26. For example, the ball bearing may be at a first end 89a of the spring 80a that contacts the annular band 26, to increase the clamp surface area that contacts the band 26. The ball bearing 88 can also ease removal of the annular band 26, for example to allow cleaning of the band 26, by allowing the band to "roll" off of the support 22 when a steady force is exerted upwardly on the band 26. A second end 89b of the radial spring 80a may comprise a compression plate 92 having a surface area that is adapted to press against the peripheral edge 30 of the support 22, to provide a greater surface area for the compression clamping. The annular band 26 may also comprise a raised ridge 90 or bump on the interior surface 82 that is positioned below the radial spring 80a when the annular band 26 is secured on the support 22. The raised ridge 90 increases the force required to move the band 26 upwardly by increasing the spring contraction distance that is necessary to roll the ball-bearing over the ridge 90. Thus, the raised ridge 90 and radial spring clamp 34 secure the annular band 26 to the support 22 during processing, while also allowing for efficient removal of the band 26 by applying a sufficient lift-off pressure.

In yet another version; the clamp 34 comprises a spring 80b that is adapted to be extended between the annular band 26 and a portion of the support 22 to hold the band 26 on the support 22, as shown for example in FIG. 2b. The spring 80b may be vertically, radially, or otherwise extended according to the desired support configuration. In the version shown in FIG. 2b, the spring 80b comprises a first end 94a that attaches to a portion of the annular band 26, such as for example a cleft 96 in the bottom portion 35 of the annular band 26. For example, the cleft 96 may be shaped and sized to provide a hook 98 on the annular band 26 that secures the first end 94a of the spring 80b. The first end 94a of the spring 80b can also be attached to the annular band 26 by other means that are known to those of ordinary skill in the art. The support 22 may comprise a support ledge 86 that extends past the peripheral edge 30 to support the annular band 26 from underneath. A second end 94b of the spring 80b is extended to attach to a clamping portion 99 of the support 22. Thus, the spring 80b is stretched between the annular band 26 and the clamping portion 99 of the support 22 to pull the annular band 26 against the support 22. The second end 94b of the spring 80b can be attached by hooking onto the clamping portion 99 of the support 22.

In one version, the second end 94b of the spring 80b is attached by means that substantially fixes the second end 94b to the support 22, for example by wrapping the second end 94b about an attachment rod 97 on the support 22, and the first end 94a is detachably secured to the band 26, as shown in FIG. 2b. For example, the second end 94b may be fixed onto the support 22 such that the first end 94a of the spring 80b can be rotated into place and stretched over the hook 98 on the annular band 26 to secure the annular band 26 onto the support 22. To remove the annular band 26, the first end 94a is lifted up and over the hook 98 and pulled away from the band 26 to release the band 26 from the support 22. Alternatively, the spring 80b may be substantially fixed onto the annular band 26, and may be detachably secured to the support 22 during substrate processing. In one version, the spring 80b that is extended between the annular band 26 and support 22 comprises a latch clip, which may comprise a bent strip of metal with high spring constant that is sufficiently high to resist straightening of the strip, and thus exerts a force on the band 26 towards the support 22. In another version, the spring 80b comprises a coil spring that is extended between the band 26 and support 22.

An example of a suitable process chamber 106 having the substrate ring assembly with the annular band 26 on the support 22 is shown in FIG. 3. The chamber 106 can be a part of a multi-chamber platform (not shown) having a cluster of interconnected chambers connected by a robot arm mechanism that transfers substrates 104 between the chambers 106. In the version shown, the process chamber 106 comprises a sputter deposition chamber, also called a physical vapor deposition or PVD chamber, which is capable of sputter depositing material on a substrate 104, such as one or more of tantalum, tantalum nitride, titanium, titanium nitride, copper, tungsten, tungsten nitride and aluminum. The chamber 106 comprises enclosure walls 118 that enclose a process zone 109, and that include sidewalls 164, a bottom wall 166, and a ceiling 168. A support ring 130 can be arranged between the sidewalls 164 and ceiling 168 to support the ceiling 168. Other chamber walls can include one or more shields 120 that shield the enclosure walls 118 from the sputtering environment.

The chamber 106 comprises a substrate support 22 to support the substrate 104 in the sputter deposition chamber 106. The substrate support 22 may be electrically floating or may comprise an electrode 170 that is biased by a power supply 172, such as an RF power supply. The substrate support 22 can also comprise a moveable shutter disk 133 that can protect the upper surface 134 of the support 22 when the substrate 104 is not present. In operation, the substrate 104 is introduced into the chamber 106 through a substrate loading inlet (not shown) in a sidewall 164 of the chamber 106 and placed on the support 22. The support 22 can be lifted or lowered by support lift bellows and a lift finger assembly (not shown) can be used to lift and lower the substrate onto the support 22 during transport of the substrate 104 into and out of the chamber 106.

The chamber 106 can further comprise a temperature control system 119 to control one or more temperatures in the chamber 106, such as a temperature of the support 22. In one version, the temperature control system 119 comprises a fluid supply adapted to provide heat exchange fluid to the support 22 from a fluid source 121. One or more conduits 123 deliver the heat exchange fluid from the fluid source 121 to the support 22. The support 22 can comprise one or more channels 125 therein, such as for example channels 125 in a metal cooling plate 127, through which the heat exchange fluid is flowed to exchange heat with the support 22 and control the temperature of the support 22, for example by heating or cooling the support 22. A suitable heat exchange fluid may be, for example, water. Controlling the temperature of the support 22 can also provide good temperature of elements that are in good thermal contact with the support 22, such as for example a substrate 104 on the surface 134 of the support 22, and also a clamped portion of a substrate ring assembly 20.

The support 22 may also comprise the substrate ring assembly 20 comprising one or more rings, such as the cover ring 70 and the annular band 26, which may be called a deposition ring, and which cover at least a portion of the upper surface 134 of the support 22, and such as a portion of the peripheral edge 30 of the support 22, to inhibit erosion of the support 22. The annular band 26 at least partially surrounds the substrate 104 to protect portions of the support 22 not covered by the substrate 104. The cover ring 70 encircles and covers at least a portion of the annular band 26, and reduces the deposition of particles onto both the annular band 26 and the underlying support 22. The substrate ring assembly 20 further comprises a clamp 34 to clamp the annular band 26 onto the substrate support 22.

A process gas, such as a sputtering gas, is introduced into the chamber 106 through a gas delivery system 112 that includes a process gas supply comprising one or more gas sources 174 that each feed a conduit 176 having a gas flow control valve 178, such as a mass flow controller, to pass a set flow rate of the gas therethrough. The conduits 176 can feed the gases to a mixing manifold (not shown) in which the gases are mixed to from a desired process gas composition. The mixing manifold feeds a gas distributor 180 having one or more gas outlets 182 in the chamber 106. The process gas may comprise a non-reactive gas, such as argon or xenon, which is capable of energetically impinging upon and sputtering material from a target. The process gas may also comprise a reactive gas, such as one or more of an oxygen-containing gas and a nitrogen-containing gas, that are capable of reacting with the sputtered material to form a layer on the substrate 104. Spent process gas and byproducts are exhausted from the chamber 106 through an exhaust 122 which includes one or more exhaust ports 184 that receive spent process gas and pass the spent gas to an exhaust conduit 186 in which there is a throttle valve 188 to control the pressure of the gas in the chamber 106. The exhaust conduit 186 feeds one or more exhaust pumps 190. Typically, the pressure of the sputtering gas in the chamber 106 is set to sub-atmospheric levels.

The sputtering chamber 106 further comprises a sputtering target 124 facing a surface 105 of the substrate 104, and comprising material to be sputtered onto the substrate 104, such as for example at least one of tantalum and tantalum nitride. The target 124 is electrically isolated from the chamber 106 by an annular insulator ring 132, and is connected to a power supply 192. The sputtering chamber 106 also has a shield 120 to protect a wall 118 of the chamber 106 from sputtered material. The shield 120 can comprise a wall-like cylindrical shape having upper and lower shield sections 120a, 120b that shield the upper and lower regions of the chamber 106. In the version shown in FIG. 3, the shield 120 has an upper section 120a mounted to the support ring 130 and a lower section 120b that is fitted to the cover ring 70. A clamp shield 141 comprising a clamping ring can also be provided to clamp the upper and lower shield sections 120a,b together. Alternative shield configurations, such as inner and outer shields, can also be provided. In one version, one or more of the power supply 192, target 124, and shield 120, operate as a gas energizer 116 that is capable of energizing the sputtering gas to sputter material from the target 124. The power supply 192 applies a bias voltage to the target 124 with respect to the shield 120. The electric field generated in the chamber 106 from the applied voltage energizes the sputtering gas to form a plasma that energetically impinges upon and bombards the target 124 to sputter material off the target 124 and onto the substrate 104. The support 22 having the electrode 170 and support electrode power supply 172 may also operate as part of the gas energizer 116 by energizing and accelerating ionized material sputtered from the target 124 towards the substrate 104. Furthermore, a gas energizing coil 135 can be provided that is powered by a power supply 192 and that is positioned within the chamber 106 to provide enhanced energized gas characteristics, such as improved energized gas density. The gas energizing coil 135 can be supported by a coil support 137 that is attached to a shield 120 or other wall in the chamber 106.

The chamber 106 can be controlled by a controller 194 that comprises program code having instruction sets to operate components of the chamber 106 to process substrates 104 in the chamber 106. For example, the controller 194 can comprise a substrate positioning instruction set to operate one or more of the substrate support 22 and substrate transport to position a substrate 104 in the chamber 106; a gas flow control instruction set to operate the flow control valves 178 to set a flow of sputtering gas to the chamber 106; a gas pressure control instruction set to operate the exhaust throttle valve 188 to maintain a pressure in the chamber 106; a gas energizer control instruction set to operate the gas energizer 116 to set a gas energizing power level; a temperature control instruction set to control a temperature control system 119 to control temperatures in the chamber 106; and a process monitoring instruction set to monitor the process in the chamber 106.

The present invention has been described with reference to certain preferred versions thereof; however, other versions are possible. For example, the substrate ring assembly 20 comprising the clamp 34 and annular band 26 can be used in other types of applications, as would be apparent to one of ordinary skill, for example, etching, CVD and cleaning processed. Other configurations of the substrate ring assembly 20 and clamp 34 can also be used. For example, other methods and configurations for clamping and annular band 26 to a support 22 can be provided. Therefore, the spirit and scope of the appended claims should not be limited to the description of the preferred versions contained herein.

What is claimed is:

1. A substrate ring assembly for a substrate support, the substrate support having a substrate receiving surface with a periphery and a peripheral edge with a top surface, the assembly comprising:
   (a) an annular band having (i) a top surface with a circumference, a protrusion and a plurality of concentric grooves which are concentric to a circumference of the annular band, each groove comprising a rounded bottom apex, (ii) an inner perimeter that surrounds the periphery of the substrate receiving surface of the substrate support, and (iii) a foot extending downwardly from the annular band to contact and press against not more than about 70% of the top surface of the peripheral edge of the substrate support, (iv) a recessed surface region extending outwardly from the downwardly extending foot, and over the top corner of the peripheral edge without contacting the peripheral edge of the substrate support, and (v) an opening extending therethrough; and
   (b) a clamp to secure the annular band to the peripheral edge of the substrate support, the clamp comprising (i) a fastener to pass through the opening and (ii) a locking bracket disposed below the annular band, the locking bracket provided to receive the fastener to lock the clamp to the peripheral edge of the substrate support.

2. An assembly according to claim 1 wherein the opening in the annular band is a substantially vertical opening and wherein the bracket comprises a raised wall adapted to press against a peripheral sidewall of the annular band to lock the annular band into a desired clamped position, a raised lip adapted to press against the peripheral edge of the substrate support, and an adjacent recess about a bottom corner of the peripheral edge.

3. An assembly according to claim 2 wherein the clamp bracket and the foot of the annular band are positioned such that the clamping force of one against the peripheral edge of the substrate support is at least partially counteracted by the other.

4. An assembly according to claim 1 further comprising a cover ring that surrounds a periphery of the annular band and has a ledge that extends inwardly over the annular band periphery, the ledge comprising a downwardly extending protrusion that is sized and shaped to reduce the deposition of process deposits on at least a portion of the top surface of the annular band.

5. An assembly according to claim 1 wherein the annular band comprises at least one of stainless steel, titanium and aluminum.

6. A substrate processing chamber comprising the substrate ring assembly of claim 1, and further comprising a substrate support, gas delivery system, gas energizer and gas exhaust.

7. A substrate ring assembly for a substrate support, the substrate support having a substrate receiving surface with a periphery and a peripheral edge with a top surface, the assembly comprising:
   (a) an annular band having (i) a top surface with a circumference, a protrusion and a plurality of concentric grooves which are concentric to a circumference of the annular band, each groove comprising a rounded bottom apex, (ii) an inner perimeter that surrounds the periphery of the substrate receiving surface of the substrate support, and (iii) a foot extending downwardly from the annular band to contact the top surface of the peripheral edge of the substrate support, and (iv) a recessed surface region extending outwardly from the downwardly extending foot, and over the top corner of the peripheral edge without contacting the peripheral edge of the substrate support; and (v) an opening extending therethrough; and
   (b) a clamp to secure the annular band to the peripheral edge of the substrate support, the clamp comprising (i) a fastener to pass through the opening and (ii) a locking bracket disposed below the annular band, the locking bracket provided to receive the fastener to lock the clamp to the peripheral edge of the substrate support.

8. An assembly according to claim 7 wherein the opening in the annular band is a substantially vertical opening and wherein the locking bracket comprises a raised wall adapted to press against a peripheral sidewall of the annular band to lock the annular band into a desired clamped position, raised lip adapted to press against the peripheral edge of the substrate support, and an adjacent recess about a bottom corner of the peripheral edge.

9. An assembly according to claim 8 wherein the clamp bracket and the foot of the annular band are positioned such that the clamping force of one against the peripheral edge of the substrate support is at least partially counteracted by the other.

10. An assembly according to claim 7 further comprising a cover ring that surrounds a periphery of the annular band and has a ledge that extends inwardly over the annular band periphery, the ledge comprising a downwardly extending protrusion that is sized and shaped to reduce the deposition of process deposits on at least a portion of the top surface of the annular band.

11. An assembly according to claim 7 wherein the annular band comprises at least one of stainless steel, titanium and aluminum.

12. A substrate processing chamber comprising the substrate ring assembly of claim 7, and further comprising a substrate support, gas delivery system, gas energizer and gas exhaust.

13. A substrate ring assembly for a substrate support, the substrate support having a substrate receiving surface with a periphery and a peripheral edge with a top surface, the assembly comprising:

(a) an annular band having:
(i) a top surface with a circumference, a protrusion and a plurality of concentric grooves which are concentric to a circumference of the annular band, each groove comprising a rounded bottom apex;
(ii) an inner perimeter that surrounds the periphery of the substrate receiving surface of the substrate support;
(iii) a foot extending downwardly from the annular band to contact the top surface of the peripheral edge of the substrate support;
(iv) a recessed surface region extending outwardly from the downwardly extending foot, and over the top corner of the peripheral edge without contacting the peripheral edge of the substrate support; and
(v) at least one substantially vertical opening therethrough;
(b) a clamp to secure the annular band to the peripheral edge of the substrate support, the clamp comprising:
(i) at least one fastener adapted to pass through the opening in the annular band; and
(ii) a bracket disposed below the annular band, the bracket adapted to receive the fastener and secure the annular band to the substrate support, the bracket comprising a raised wall to press against a peripheral sidewall of the annular band to lock the annular band into a desired clamped position, a raised lip to press against the peripheral edge of the substrate support, and an adjacent recess about a bottom corner of the peripheral edge.

* * * * *

UNITED STATES PATENT AND TRADEMARK OFFICE
CERTIFICATE OF CORRECTION

PATENT NO. : 7,670,436 B2
APPLICATION NO. : 10/981261
DATED : March 2, 2010
INVENTOR(S) : Miller et al.

It is certified that error appears in the above-identified patent and that said Letters Patent is hereby corrected as shown below:

Column 10, line 16, cancel the text beginning with "2. An assembly according to" and ending with "annular band." in column 10, line 36 and insert the following claims:

--2. An assembly according to claim 1 wherein the opening in the annular band is a substantially vertical opening and wherein the locking bracket comprises a raised wall adapted to press against a peripheral sidewall of the annular band to lock the annular band into a desired clamped position, a raised lip adapted to press against the peripheral edge of the substrate support, and an adjacent recess about a bottom corner of the peripheral edge of the substrate support.

3. An assembly according to claim 2 wherein the clamp locking bracket and the foot of the annular band are positioned such that the clamping force of one against the peripheral edge of the substrate support is at least partially counteracted by the other.

4. An assembly according to claim 1 further comprising a cover ring that surrounds a periphery of the annular band and has a ledge that extends inwardly over a periphery of the annular band, the ledge comprising a downwardly extending protrusion that is sized and shaped to reduce the deposition of process deposits on at least a portion of the top surface of the annular band.--

Column 11, line 1, cancel the text beginning with "8. An assembly according to" and ending with "annular band." in column 11, line 20 and insert the following claims:

--8. An assembly according to claim 7 wherein the opening in the annular band is a substantially vertical opening and wherein the locking bracket comprises a raised wall adapted to press against a peripheral sidewall of the annular band to lock the annular band into a desired clamped position, a raised lip adapted to press against the peripheral edge of the substrate support, and an adjacent recess about a bottom corner of the peripheral edge of the substrate support.

9. An assembly according to claim 8 wherein the locking bracket and the foot of the annular band are positioned such that the clamping force of one against the peripheral edge of the substrate support is at least partially counteracted by the other.

Signed and Sealed this

Tenth Day of August, 2010

David J. Kappos
*Director of the United States Patent and Trademark Office*

10. An assembly according to claim 7 further comprising a cover ring that surrounds a periphery of the annular band and has a ledge that extends inwardly over a periphery of the annular band, the ledge comprising a downwardly extending protrusion that is sized and shaped to reduce the deposition of process deposits on at least a portion of the top surface of the annular band.--